Feb. 14, 1961 R. SILBERBACH 2,972,114

AMPLIFIER CIRCUIT

Filed Dec. 23, 1957 2 Sheets-Sheet 1

INVENTOR.
Richard Silberbach

BY Mueller & Aichele

Attys.

INVENTOR.
Richard Silberbach
BY Mueller & Aichele
Attys.

United States Patent Office 2,972,114

Patented Feb. 14, 1961

2,972,114

AMPLIFIER CIRCUIT

Richard Silberbach, Chicago, Ill., assignor to Motorola, Inc., Chicago, Ill., a corporation of Illinois Filed Dec. 23, 1957, Ser. No. 704,593

2 Claims. (Cl. 330—15)

This invention relates to signal amplifier circuits and more particularly to a transistorized amplifier which is compensated to provide improved operation over varying temperature conditions.

Present day power transistors, such as commonly used in power amplifier circuits, are temperature sensitive and the collector current in such transistors may be varied to an undesirable degree with a change in temperature of the device. While there are various means known to offset change in transistor characteristics with temperature, the known means are not altogether suitable for use in high power circuits, such as employed in audio frequency power amplifiers in automobile radio receivers. In such applications the circuit must be adapted to operate over wide ambient temperature conditions and the possibility of damage to circuit components, due to excess current, and the distortion of signals, due to conduction changes of the transistor, must be minimized.

Accordingly, it is an object of this invention to provide a temperature compensation system for a transistorized amplifier circuit which permits successful operation over a wide temperature range and at high power levels.

Another object is to provide a transistorized power amplifier of simple and inexpensive construction.

A still further object is to provide an improved transistorized power amplifier in which the collector current of the transistor can be substantially linearized at high temperatures and modified at low temperatures to prevent signal distortion in the amplifier and damage to circuit components.

A further object is to provide a transistorized power amplifier with decreased circuit losses therein in order to furnish a greater output power from the circuit.

A feature of the invention is the provision of a temperature compensating bias network for a transistor used in an amplifier circuit wherein the network includes resistor means having opposite temperature coefficients to modify the bias with a change in temperature of the transistor.

Another feature is the provision of a bias voltage divider network for a transistor used in a signal amplifier wherein a positive temperature coefficient resistor and a negative temperature coefficient thermistor are series coupled to a voltage source and mounted in positions to be subject to a change in temperature corresponding to change in temperature of the transistor for altering the bias on the transistor with temperature changes thereof.

Still another feature of the invention is the provision of a voltage divider bias network with a thermistor coupled between base and emitter of a transistor and a positive temperature coefficient resistor coupled to the base and to a voltage source for modifying the bias on the transistor with temperature change and for improved biasing of the transistor at both high and low temperature conditions of the transistor.

A still further feature of the invention is the provision of such an amplifier with a temperature compensating network used in the base-emitter circuit of the transistor in such a way as to do away with the usual emitter resistor, providing protection for "runaway" conditions, in order to reduce the power losses in the amplifier circuit and increase the output of the amplifier.

Further objects, features and the attending advantages thereof will be apparent upon consideration of the following description when taken in conjunction with the accompanying drawings in which.

In a sepcific form of the invention the transistor amplifier includes a voltage divider bias network with series coupled positive and negative temperature coefficient resistors, with the negative temperature coefficient resistor connected between the base and emitter of the transistor to lower the base bias at higher temperatures and with the positive temperature coefficient resistor coupled in a circuit supplying current to the negative temperature coefficient resistor for further lowering the bias at increased temperatures. The positive temperature coefficient resistor tends to linearize the response of the thermistor at higher temperatures and to add cumulatively to the response of the thermistor at low temperatures in order to tend to offset the change in transistor conduction characteristics under such conditions. With such a bias compensation network it is also possible to omit the usual series emitter resistor, generally used to prevent runaway conditions due to self-heating of the transistor and the ensuing increase in current, thus avoiding any power loss from this emitter resistor in the emitter-collector output circuit.

Figures 1, 2, 3:
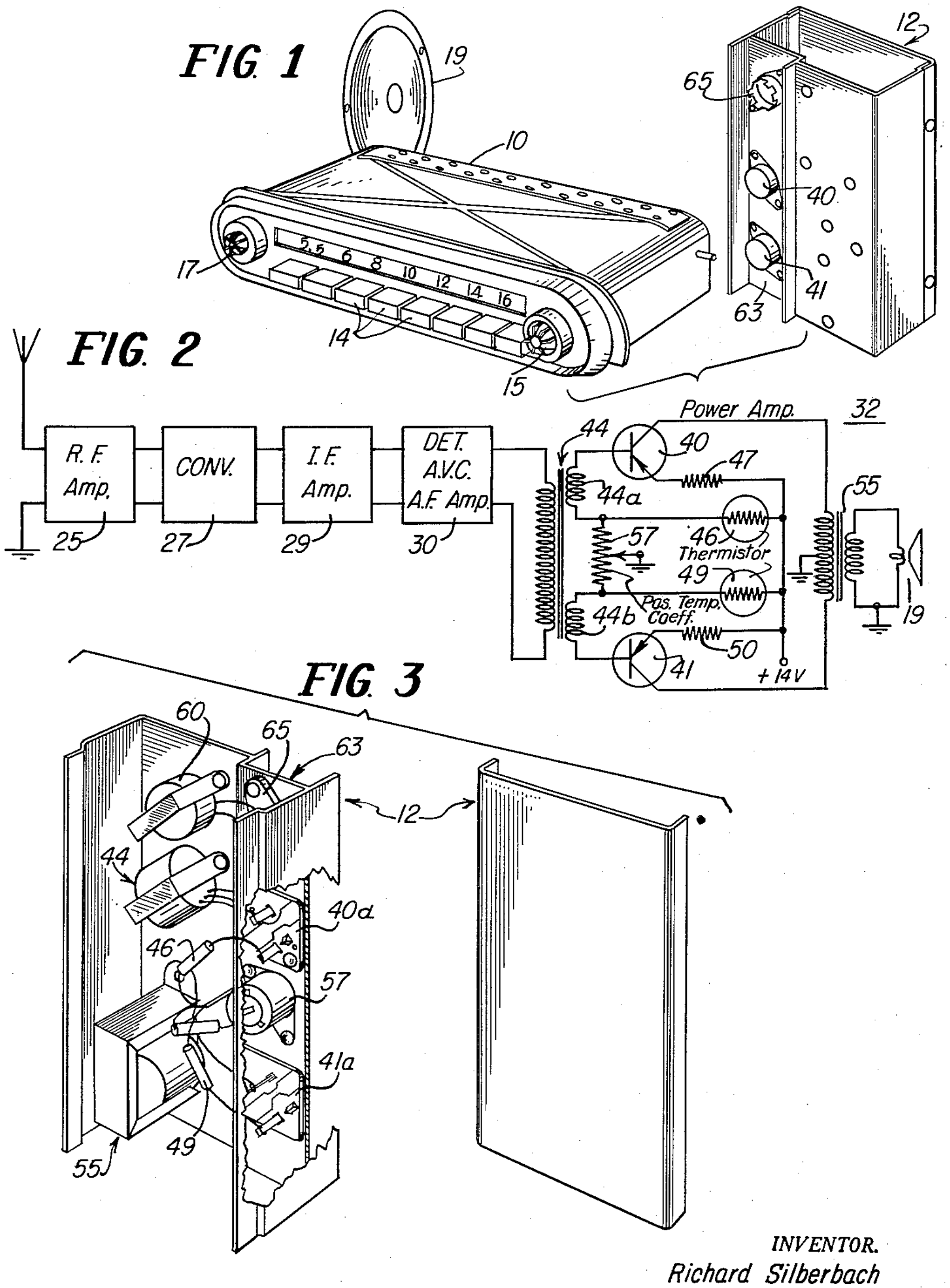
Fig. 1 is a perspective view of an automobile radio receiver in which the invention may be incorporated.
Fig. 2 is a diagram of a radio receiver incorporating the invention.
Fig. 3 is a perspective view of an amplifier of the receiver of Fig. 1 which incorporates the invention.

Fig. 1 shows an automobile radio receiver in which the invention finds particular utility. The receiver includes suitable amplifying and tuning apparatus as well as demodulating circuits in the housing 10 from which audio signals are applied to the audio power amplifier contained in the housing 12. The housing 10 includes pushbuttons 14 to receive predetermined stations and a continuous tuning knob 15 as well as a volume control and power switch operated by knob 17. When installed in an automobile, the power amplifier supported by housing 12 is connected to a loudspeaker 19 and the apparatus is also connected to an antenna (not shown).

As shown in Fig. 2 the circuits contained within housing 10 may include a radio frequency amplifier stage 25 which supplies signals to a converter stage 27 in which the signals may be converted to an intermediate frequency. Intermediate frequency signals are amplified in IF amplifier 29 and applied to a suitable demodulation, or detector, stage 30 which may also include an audio frequency amplifier or driver stage. The audio signals are then applied to a power amplifier stage 32 which may be supported in the housing 12, or alternatively the housings 10 and 12 may be constructed as a single unit.

Power amplifier circuit 32 includes a pair of transistors 40 and 41 which are connected in a push-pull circuit to drive loudspeaker 19. Input signals are applied from the circuit 30 to the input transformer 44 which includes a secondary winding *44a* connected between the base of transistor 40 and series connected with thermistor 46 and resistor 47 to the emitter of transistor 40 in order to apply driving signals between the base and emitter. Similarly, secondary winding *44b* is connected to the base of transistor 41 and through thermistor 49 and resistor 50 to the emitter of transistor 41. The interconnection of resistors 47 and 50 and thermistors 46 and 49 is connected to a positive potential source which may be provided by the automobile electrical system, here designated as a nominal 14 volts. The collectors of transistors 40 and 41 are connected to the primary of output transfromer 55 which has a grounded center tap. The secondary of this output transformer is connected to the loudspeaker 19. Accordingly, the push-pull output provided in the collector circuits of the transistors is used to drive the loudspeaker 19.

A balance potentiometer 57 includes a fixed portion connected between the junction of secondary winding *44a* and thermistor 46 and the junction of secondary winding *44b* and thermistor 49. A movable arm of resistor 57 is connected to ground. It may be noted that a portion of resistor 57 together with thermistor 46 form a voltage divider network connected across the potential source and that the potential appearing across thermistor 46 is applied between base and emitter of transistor 40 as a bias therefor. Similarly, a corresponding portion of resistor 57 together with thermistor 49 provide a base-emitter bias for transistor 41. The series emitter resistors 47 and 50, commonly used in amplifiers of this type, prevent a runaway condition of the transistors due to self-heating. Accordingly, if the collector current should increase causing heating of one of the transistors, the emitter current would increase thus increasing the voltage drop across one of the emitter resistors thereby increasing the bias on the transistor and reducing conduction. As pointed out subsequently, these resistors may not be necessary in the amplifier of the invention. Resistor 57 may be adjusted in order that the conduction characteristics of transistors 40 and 41 are matched to provide balanced output and to minimize distortion in the push-pull circuit.

In accordance with the invention, thermistors 46 and 49 have respective negative temperature coefficients and resistor 57 has a positive temperature coefficient. Therefore, it may be seen that as the thermistors and the resistor increase in temperature, the resistance of the thermistor will decrease to decrease the bias on the associated transistor and the resistance of resistor 57 will increase thus tending to decrease the current in each biasing network to further decrease the bias on the associated transistor.

As shown in Fig. 3 the transistors 40 and 41 are respectively mounted in sockets *40a* and *41a* and the transformers 44 and 55 are also included in the housing 12. A filter choke 60 is shown supported by the housing 12 and it may be used to filter the supply voltage along with other suitable components not shown in Fig. 2 It may also be seen in Figs. 1 and 3 that transistors 40 and 41 are supported in a heat sink 63 which is a channel shaped portion of housing 12 having high heat conductivity so that the transistors may be mounted in heat conductive relation therewith in order to dissipate heat generated during operation. The thermistors 46 and 49 as well as the balancing resistor 57 are mounted within the housing 12 and during operation of the amplifier will be subjected to a temperature corresponding to the general ambient temperature in which the transistors operate. A connector receptacle 65 is also included in the housing 12 and this is used for electrical power and signal coupling to the amplifier.

In a constructed embodiment of the power amplifier circuit 32 components of the following values were utilized and provided successful operation of the circuit:

| | |
|---|---|
| Transistors **40, 41** | 2N176. |
| Thermistors **46, 49** | 7.5 ohms at 25° C. (E. G. Globar B–1800 from Carborundum Co.). |
| Resistors **47, 50** | .33 ohm. |
| Resistor **57** | 400 ohms with a positive temperature coefficient of .006 ohm per ohm per degree C. |
| Transformers **44, 55** | Impedance matched for their respective input and output circuits. |

Figure 4:
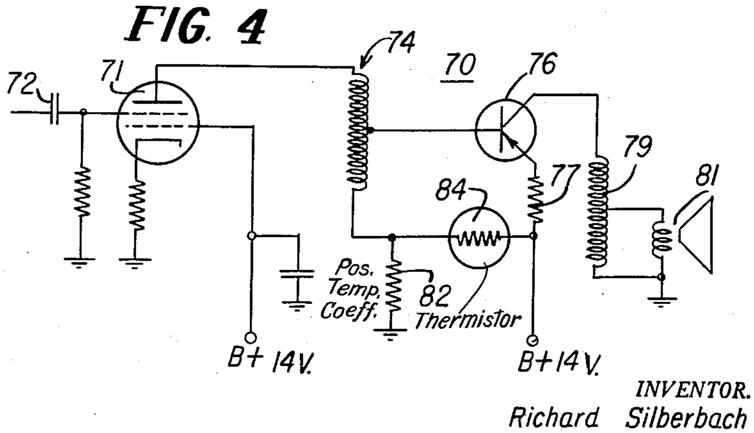

The circuit of Fig. 4 shows a single ended power amplifier circuit 70 having a modified signal input circuit. The driver stage is shown as a tube 71 having its first grid connected to B-plus and the second grid driven by input signals through blocking capacitor 72. The anode is connected to auto transformer 74, a tap of which is coupled to the base of transistor 76. The emitter of transistor 76 is coupled to B-plus through the emitter resistor 77 and the collector of transistor 76 is coupled through output transformer 79 to ground. A loudspeaker 81 is coupled across a portion of the winding of transformer 79. Resistor 82 and thermistor 84 are series connected between ground and B-plus to form a voltage divider for biasing the transistor 76. The junction of resistor 82 and thermistor 84 is coupled to one end of the winding of transformer 74 so that a direct path is provided therethrough to the base of the transistor.

As in the circuit shown in Fig. 2 the network 82, 84 temperature stabilizes the circuit and resistor 82 has a positive temperature coefficient and thermistor 84 has a negative temperature coefficient so that there is a tendency to lower the base bias with a rise in temperature and thereby reduce the collector current. Transformer 74 provides an impedance match from the high output impedance of tube 71 to the low input impedance of the amplifier stage 70 and the tap on the winding of the transformer is selected to furnish the desired low impedance for the base to emitter circuit of the transistor 76. This system maximizes the power transfer from the tube to the transistor.

It may be noted that the tube 71 and the transistor 76 are direct-current coupled and that the anode current for tube 71 will be supplied through the emitter resistor 77 and the emitter and base electrodes of transistor 76 as well as through the thermistor 84. As the temperature rises the resistance of thermistor 84 decreases allowing a greater percentage of current to flow therethrough and thus reducing the base-emitter current to retard the heating of the transistor due to excess current.

In the circuit of Fig. 4 the emitter resistor 77 is in a series path between B-plus and the emitter-collector circuit of the transistor and the output transformer 79. Accordingly, heat stabilization is obtained since an increase in the current through this resistor will tend to raise the bias of transistor 76, thus causing a decrease in current and a balance point will be reached before a "runaway" condition is established in the transistor where an increase in the temperature thereof causes an increase in the current in the transistor which further causes an increase in the temperature. However, the inclusion of resistor 77 in the output circuit, while this resistor may be of comparatively small value and even less than 1 ohm, can cause a power loss in the power amplifier circuit of the type described. It has been found that with the temperature compensation circuit utilizing both positive and negative temperature coefficient resistors, such as resistor 82 and thermistor 84 the series emitter resistor to prevent runaway of the amplifier circuit can be omitted. A circuit of this type is shown in Fig. 5.

Figure 5:
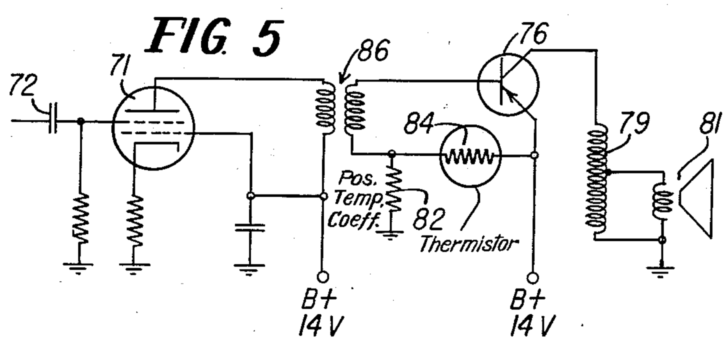
Figs. 4 and 5 are schematic diagrams of modified forms of the invention.

In Fig. 5 the components corresponding to those of

Fig. 4 are given in the same reference characters. In this circuit the coupling of the driver tube to the transistor is made through a coupling transformer 86 having a primary winding series connected between B-plus and the anode of tube 71. A secondary winding of transformer 86 is connected between the base of transistor 76 and the junction of resistor 82 and thermistor 84. This circuit therefore provides the usual transformer coupling between stages. However, the omission of emitter resistor 77 does not depend on the difference of interstage coupling in Figs. 4 and 5, this different interstage coupling being shown in Fig. 5 merely for the purpose of illustrating conventional coupling between stages.

In the circuit of Fig. 5 the thermistor 84 is connected directly to the emitter of transistor 76 and the output loop is from B-plus through the emitter-collector electrodes and through the output transformer 79. As in the previously described circuit, resistor 82 has a positive temperature coefficient and thermistor 84 has a negative temperature coefficient so that if there is an increase of the collector current due to an increase in temperature, the resistance of thermistor 84 is decreased thus reducing the base to emitter voltage and making the base more positive which in turn reduces the collector current. Resistor 82 is used to aid the compensating effect of thermistor 84 and this resistor increases in resistance with an increase in temperature also tending to reduce the base bias and the collector current. The temperature stabilization thus provided makes it unnecessary to use a series emitter resistor or the conventional bypass capacitor between the secondary of transformer 86 and the emitter, which capacitor must be of large value in order to couple audio signals with a minimum deterioration of low frequencies.

It should be understood that the physical relationship of the components in the circuits of Figs. 4 and 5 would preferably be similar to that shown in Fig. 3.

Figure 6:
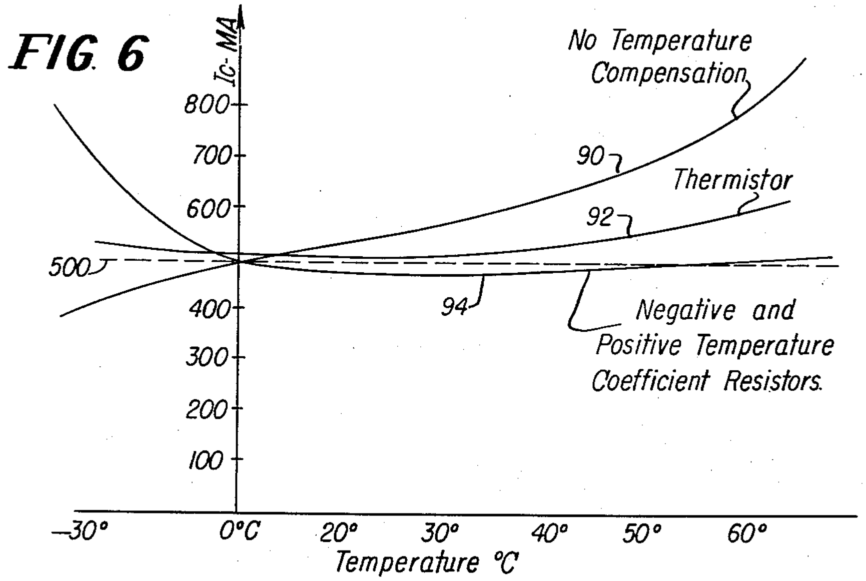
Fig. 6 is a graph useful in explaining the operation of the invention.

The graph of Fig. 6 may be considered in order to better understand the operation of the stabilization network. The graph shows collector current versus temperature for a typical audio power amplifier stage, such as used in an automobile radio receiver. Curve 90 illustrates the behavior of collector current in a circuit utilizing standard resistors for the biasing network for the base-emitter circuit. It may be noted that there is a wide departure from what is designated to be the design current, namely 500 milliamperes, particularly at the higher temperatures. At temperatures below 0° C. the collector current actually decreases due to the temperature coefficient of the transistor itself. Curve 92 illustrates the collector current variation for the power amplifier when a thermistor, such as thermistor 84, and a standard resistor are used for resistor 82. Under such conditions the quiescent collector current is maintained at nearer the design level over a wide temperature range although there is still a marked increase in collector current at high temperatures. When both thermistor 84 and the positive temperature coefficient resistor 82 are used, the collector current changes according to the curve 94, with some variation due to differences in characteristics among transistors of a particular type. It may be noted that between a wide range above 0° C. the current remains very near the design level thereby minimizing distortion of signals in the amplifier and minimizing the possibility of damage to components through conduction of excess current. In the region below 0° C., as shown by curve 94, the collector current increases and this is a desirable effect for the initial warm-up of the amplifier in ambient temperature conditions below 0°. Due to this characteristic of the circuit, the initial collector current will be somewhat increased thereby tending to warm the transistor and normalize the entire amplifier in its housing to bring the apparatus toward a design temperature which would normally be in the region of 20° C. for most applications.

In selecting components for use in an amplifier constructed in accordance with the invention, it is preferred to use a nickel alloy for resistor 82, or resistor 57, in order to obtain the benefits of the highest positive temperature coefficient which is practical. Present day temperature coefficients of such resistance material are in the range of .004 to .006 ohm per ohm per degree. A satisfactory manner of determining the values of the components to use includes a consideration of a curve, such as curve 90, showing the collector current without temperature compensation in order to determine the current rise over the expected temperature range, for example, the current rise over a temperature increase of 40° (from 20° C., to 60° C.). Consideration of this current change together with the available positive temperature coefficient resistor can then determine the value of the thermistor, such as thermistor 84 or thermistors 46 and 49, to be used in the biasing network in order to remain within design tolerances of the desired collector current.

As previously indicated, it is desirable to place the transistors, the thermistors, and the positive temperature coefficient resistors in close physical proximity so that they are subjected to essentially the same ambient temperature. However, in a given application, the physical spacing may be varied if it is found that during use of the particular equipment the temperatures of these various components change in relative correspondence so that the compensating and stabilization network can function as described.

Accordingly, this invention provides a transistor amplifier circuit which operates successfully over a wide temperature range, while at the same time maintaining high power output with minimum signal distortion and possibility of damage to components. The amplifier circuit is of comparatively simple construction and requires components which are inexpensive, thus making the circuit entirely practical for applications in radio receivers such as may be utilized in automobiles.

I claim:

1. In a transistorized push-pull signal amplifier the combination of a pair of transistors having respective base, emitter and collector electrodes, voltage divider means including a bias control potentiometer having end terminals and a variable intermediate terminal and first and second resistor means individually connecting said end terminals of said potentiometer to a common terminal, potential supply means connected across said intermediate terminal and said common terminal, means connecting said emitter electrodes to said common terminal, input circuit means providing direct-current connections from said end terminals of said potentiometer to said base electrodes of said transistors respectively, output circuit means direct current coupled across said collector electrodes and connected to said intermediate terminal of said potentiometer, said potentiometer having a predetermined positive temperature coefficient, said first and second resistor means having predetermined negative temperature coefficients, said potentiometer and said first and second resistor means being supported in respective positions to be subjected to temperature changes corresponding to temperature changes of said transistors, whereby the resistive value of said potentiometer increases with temperature and the resistive value of said first and second resistor means decreases with an increase in temperature for decreasing the potential between said base and emitter electrodes with an increase in temperature.

2. In a transistorized push-pull signal amplifier the combination of a pair of transistors each having respective output electrodes and pairs of input electrodes, an input transformer for supplying input signals and having first and second winding portions respectively connected to one input electrode of each of said transistors, voltage divider means connected to said first and second winding portions and to the other one of said input electrodes of each of said transistors for biasing said input electrodes, said voltage divider means including a bias and balance control potentiometer having end terminals and a variable intermediate terminal and resistor means comprising first and second resistors connected to said potentiometer and forming respective voltage divider portions with sections thereof between said intermediate terminal and said end terminals, potential supply means connected between said intermediate terminal and said resistor means for energizing said voltage divider means, said end terminals being coupled between said input electrodes of said transistors so that variation of said intermediate terminal provides balancing of the push-pull operation of said transistors, output load impedance means direct current coupled between said output electrodes and having an intermediate portion thereof connected to said potential supply means, said potentiometer having a predetermined positive temperature coefficient, said resistor means having a predetermined negative temperature coefficient, said potentiometer and said resistor means being supported in respective positions to be subjected to temperature changes corresponding to temperature changes of said transistors, whereby the resistive value of said potentiometer increases with temperature and the resistive value of said resistor means decreases with an increase in temperature for decreasing the bias potential between said input electrodes with an increase in temperature.

References Cited in the file of this patent

UNITED STATES PATENTS

| | | |
|---|---|---|
| 1,924,469 | Strecker | Aug. 29, 1933 |
| 2,680,160 | Yaeger | June 1, 1954 |
| 2,778,884 | Amatniek | Jan. 22, 1957 |
| 2,808,471 | Poucel | Oct. 1, 1957 |
| 2,810,024 | Stanley | Oct. 15, 1957 |
| 2,810,071 | Race | Oct. 15, 1957 |
| 2,823,312 | Keonjian | Feb. 11, 1958 |
| 2,831,114 | Van Overbeek | Apr. 15, 1958 |
| 2,915,600 | Starke | Dec. 1, 1959 |